United States Patent [19]

Parkinson et al.

[11] Patent Number: 4,962,326
[45] Date of Patent: Oct. 9, 1990

[54] REDUCED LATCHUP IN PRECHARGING I/O LINES TO SENSE AMP SIGNAL LEVELS

[75] Inventors: Ward D. Parkinson; Wen-Foo Chern, both of Boise, Id.

[73] Assignee: Micron Technology, Inc., Boise, Id.

[21] Appl. No.: 222,842

[22] Filed: Jul. 22, 1988

[51] Int. Cl.$^5$ .................... H03K 17/16; H03K 19/003
[52] U.S. Cl. ..................................... 307/443; 307/565; 307/530; 365/203
[58] Field of Search ..................... 307/443, 272.3, 280, 307/565, 530; 365/203, 206, 196

[56] References Cited

U.S. PATENT DOCUMENTS

| Re. 32,682 | 5/1988 | Eaton et al. | 365/203 |
|---|---|---|---|
| 3,976,892 | 8/1976 | Buchanan | 307/481 |
| 4,096,401 | 6/1978 | Hollingsworth | 307/355 |
| 4,208,730 | 6/1980 | Dingwall et al. | 365/203 |
| 4,331,968 | 5/1982 | Gosney, Jr. et al. | 357/23 |
| 4,355,377 | 10/1982 | Sud et al. | 365/203 |
| 4,494,221 | 1/1985 | Hardee et al. | 365/203 |
| 4,514,831 | 4/1985 | Oritani | 365/203 |
| 4,638,462 | 1/1987 | Rajeevakumar et al. | 365/203 |
| 4,649,520 | 3/1987 | Eitan | 365/185 |
| 4,794,570 | 12/1988 | Rose et al. | 365/203 |

Primary Examiner—Stanley D. Miller
Assistant Examiner—Richard Roseen
Attorney, Agent, or Firm—Stan Protigal; Angus Fox, III; Jon Busack

[57] ABSTRACT

I/O lines on a CMOS circuit are precharged to preferred voltage levels in order to avoid latch up. The precharging is achieved by using N channel transistors to provide a precharge which is at a threshold voltage ($V_T$) below bias voltage $V_{CC}$, or ($V_{CC}-V_T$). This results in a lower forward bias when $V_{CC}$ bumps down after the I/O lines are floated. By lowering the precharge voltage by a level corresponding to a threshold voltage ($V_T$), the allowed range of power supply voltage bumping is increased by this amount. This eliminates the destructive effect of a negative bump of $V_{BE}$, which would have presented a diode forward bias condition. Instead, the power supply may bump to ($V_{BE}+V_T$).

14 Claims, 5 Drawing Sheets

(PRIOR ART)

REDUCED LATCHUP IN PRECHARGING I/O LINES TO SENSE AMP SIGNAL LEVELS

FIELD OF THE INVENTION

This invention relates to semiconductor circuit devices and to circuitry on such semiconductor devices. More specifically, the invention relates to biasing circuits for signal lines on semiconductors.

BACKGROUND OF THE INVENTION

This invention relates to semiconductor devices which are supplied at signal levels at various EMF (electromotive force) levels or potentials, usually referred to as "voltage levels". These voltage levels typically include a ground or substrate potential $V_{SS}$ and a signal level potential $V_{CC}$. The device is usually driven by current supplied at $V_{CC}$ to $V_{SS}$.

CMOS technologies, with their low static power consumption and high speed, has become the technology of choice for almost all VLSI applications. Because it employs both p-channel and N-channel MOS transistors, parasitic NPN and PNP bipolar transistors are formed. Together they form the PNPN layer which is commonly known as the silicon-controlled rectifier (SCR); they stay on once they have been turned on. This mode is known as "latch-up" and can be self-destructive because excessive currents can flow through the junctions. The reduction in dimensions further accentuates this parasitic component responsible for a self-destructive mode.

Figure 1A:
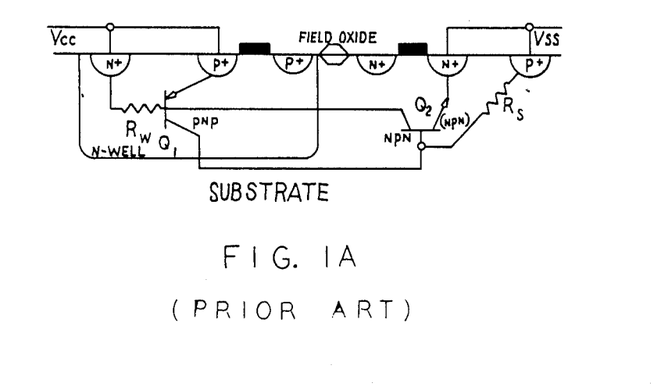
FIGS. 1A and B show two coupled transistors, in which a p+ source/drain and a p substrate form the emitter and collector regions of a vertical PNP transistor.

In order to model latch-up, it is convenient to use the four-layer configuration as two coupled transistors, shown in FIG. 1. As illustrated in FIG. 1A, a p+ source/drain and a P substrate form the emitter and collector regions of a vertical PNP transistor, schematically shown as Q1. An N+ source/drain and an n-well form a lateral NPN transistor, schematically shown as Q2. The parasitic vertical PNP and lateral NPN bipolar transistors Q1, Q2 can introduce latch-up if either of the base-emitter junctions becomes forward biased. The parasitics can be described as a four layer P+NPN+ diode called a silicon-controlled rectifier (SCR). The SCR's operation depends on an internal feedback mechanism triggered by operating voltage above $V_{CC}$ or below ground; by internal thresholds; by radiation-induced currents or by photo excitation.

The most common cause is due to voltage overshoot and undershoot at the input and output terminals (voltage "bumping") with respect to the anode voltage and the ground potential, respectively. The effects of voltage "bumping" to lower potentials is of primary concern in this invention.

Figure 1B:
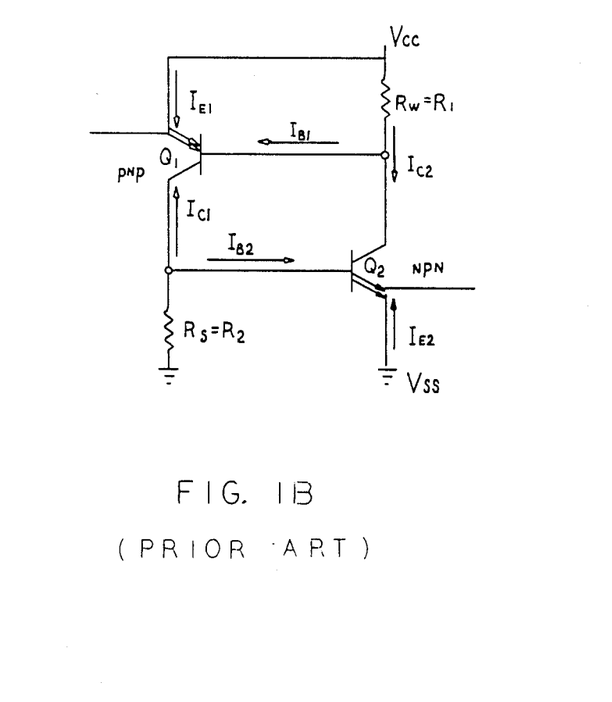

A p-channel device will latch up when its source or drain is forced above $V_{CC}$ with a charge current, called the trigger current. This current causes Q1 to become forward biased and to turn on. Referring to FIG. 1B, Q1's collector current, IC1, now feeds with the base of Q2 (IB2) and the parasitic resistor R2. Since R2 pulls base current from Q2, it causes a voltage appear at Q2's base. When this potential reaches the range of 0.6 to 0.7 volts (1NPN×R2), Q2 turns on and begins to feed current into R1 and Q1's base. This latch-up loop will continue until voltage is removed or the circuit self destructs.

An n-channel device will latch up when its source or drain voltage is forced below $V_{SS}$ and a similar process begins at Q2. The current required to initiate latch-up can be expressed in terms of the fundamental transistor parameter alpha ($\propto$). The variation of alpha is a fundamental feature of the SCR.

Ignoring for the moment the resistive paths, then from bipolar circuit theory, the collector currents flowing into Q1 and Q2 are given as:

$$I_{C1} = \propto_p I_E - I_{C01}$$

$$I_{C2} = \propto_n I_E + I_{C02}$$

where the Ic0 are the collector saturation currents. We can set the sum of the currents flowing into Q1 equal to 0 to show that $$I_E + I_{C1} - I_{C2} = 0$$

$$I_E = I_{C1} - I_{C2} = 0$$

by substituting the expressions for the collector currents, we get $$IE \frac{I_{C01} = I_{C02}}{1 - (\propto n + \propto p)}$$

This equation predicts that as the sum of the transistor alphas approaches unity, the current increases rapidly. The circuit will latch up if the current gains are large enough that the sum ($\propto n + \propto p$) is equal or greater than 1. (The terminal current does not increase indefinitely; as the sum of the alphas approaches unity, this simplified analysis breaks down.)

Reducing the susceptibility to latch-up can therefore be accomplished by processing techniques that reduce resistances.

Figure 2:
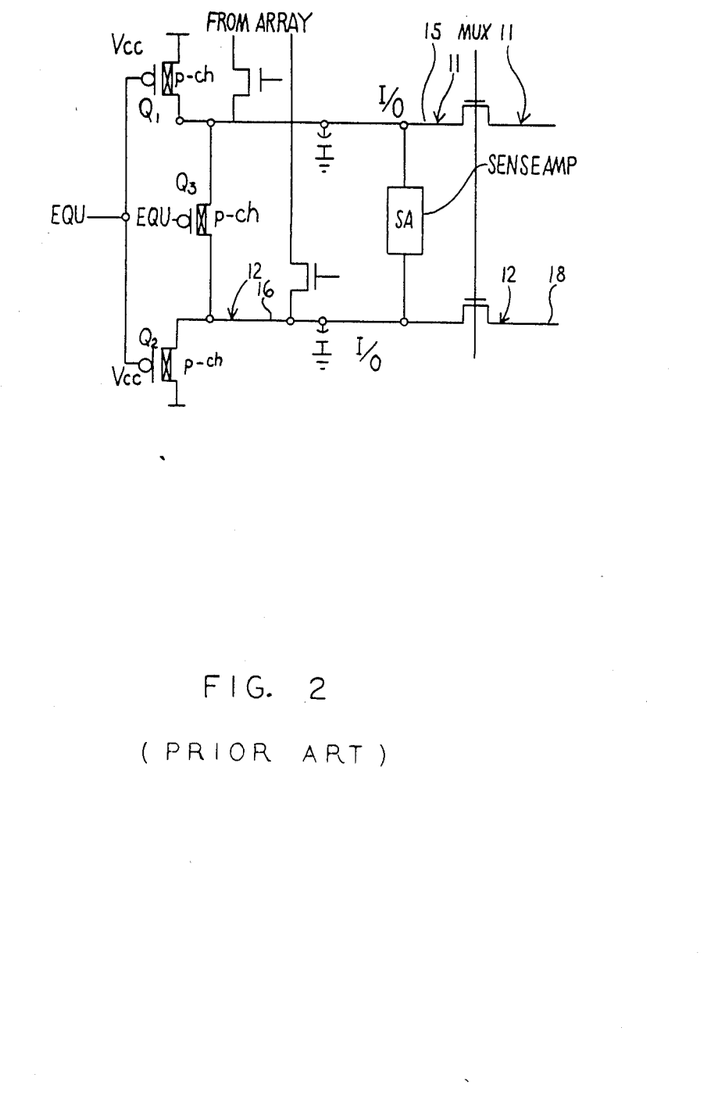
FIG. 2 schematically shows a prior art configuration for precharging I/O lines to a voltage $V_{CC}$ in order to permit signal sensing.

FIG. 2 shows a prior art configuration of I/O lines 11, 12 on a semiconductor, in which the I/O lines are precharged to a voltage $V_{CC}$ in order to permit signal sensing. The I/O lines 11, 12 include sense line portions 15, 16 and external connection portions 17, 18. The precharging is done by gating on precharge transistors Q1, Q2 with an equalization signal EQU, in order to bring the sense line portions 15, 16 of the I/O lines to $V_{CC}$. The equalization signal EQU is also used to gate on a balance transister Q3, which effects conduction between the sense line portions 15, 16 of the I/O lines 11, 12. The precharge transistors Q1, Q2 (and Q3) are p-channel transistors. Transistors Q1–Q3 are gated off after a precharge period, causing the sense line portions 15, 16 to float.

If sense line portion 15 and 16 of the I/O lines 11, 12 remain isolated from external connection portions 17 and 18, then the I/O lines will float at $V_{CC}$.

In a present configuration, when $V_{CC}$ is at 6 volts, then sense line portions 15, 16 are floated at 6 volts. If $V_{CC}$ then "bumps", for example, to 5 volts ($V_{CC}-1V$), sense line portions 15, 16 exceed $V_{CC}$, by 0.7 volts, resulting in a forward bias of Q1 and Q2 wells of the 0.7 volts. Since Q1 and Q2 are p-channel transistors, the forward bias of P+ drain and an N− well results in a potential latch-up condition. Because current flows, the forward bias also results in a reduction in sense signal strength.

The precharge transistors Q1 and Q2, and particularly the balance transistor Q3 are vulnerable to $V_{CC}$ "bumping" down to a lower potential than a precharge voltage of the I/O lines 11, 12, once the I/O lines are floated.

SUMMARY OF THE INVENTION

In accordance with the present invention, precharging of I/O lines on a semiconductor is achieved by using N-channel transistors to provide a precharge which is at a threshold voltage ($V_T$) below bias voltage $V_{CC}$ ($V_{CC} - V_T$). This results in a lower forward bias when $V_{CC}$ bumps down after the I/O lines are floated.

If the $V_{CC}$ "bumps" downward, this will also drive the potentials on the I/O lines downward, thereby causing a distortion in signal levels on the I/O lines. This is because the signal levels on the I/O lines normally are driven slightly high or low by the array after equalization, permitting a sense amp to detect signal levels provided by the array. If the I/O lines ar bumped down during equalization, the floated potentials of the I/O lines are driven together, thereby resulting in an ambiguity in the sensed outputs from the array. It is therefore important to stabilize the sensed output of the I/O line sufficiently to avoid ambiguities in the output of the array as sensed from the floated I/O lines.

By lowering the precharge voltage by a level corresponding to a threshold voltage, $V_T$, the allowed range of power supply voltage bumping is increased by this amount. This eliminates the destructive effect of a negative bump of VBE, which would have presented a diode forward bias condition. Instead, the power supply may bump to (VBE+$V_T$).

In a first embodiment of the invention, the I/O lines are reduced in precharge levels by feeding precharge current through an n-channel diode which has a threshold voltage corresponding to a desired voltage drop. The N-channels of the equalization transistors are permitted to remain at the full bias levels, thereby increasing the voltage "bump" tolerance of the transistors. In a further refinement of the invention, precharge currents are connected on a data bus side of isolating transistors, thereby causing the sense line portions of the I/O lines to drop by a voltage threshold corresponding to that of the isolating transistors.

DETAILED DESCRIPTION OF THE PREFERRED EMBODIMENT

Figure 3:
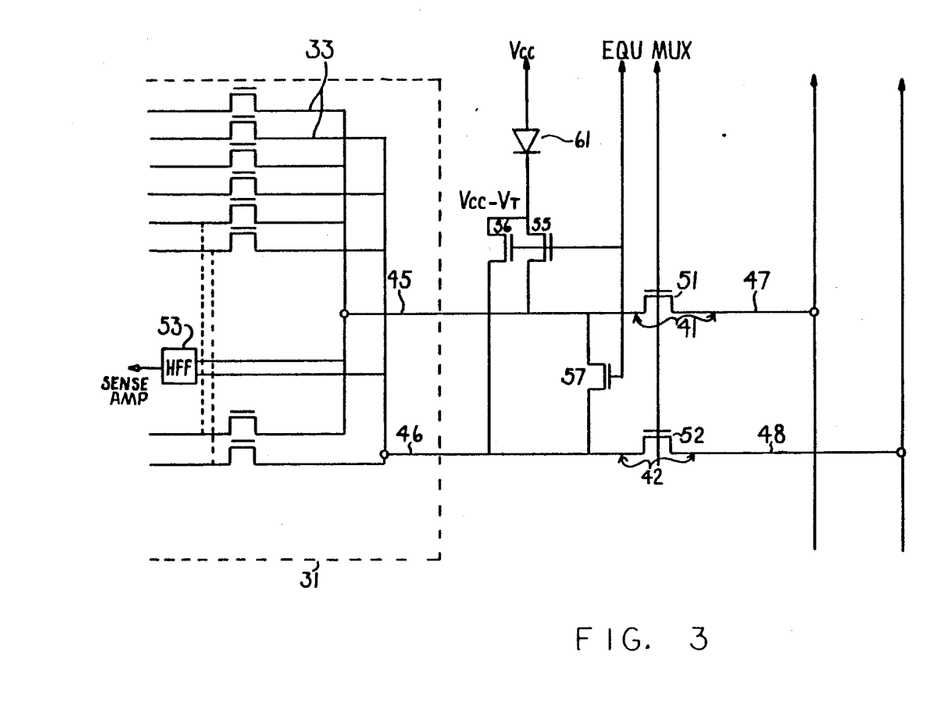
FIG. 3 shows a configuration in which I/O lines are precharged to levels reduced by $V_T$ of a junction device.

FIG. 3 shows a configuration in which a signal array 31 provides a series of signals from digit lines 33 to I/O lines 41 or 42. Each I/O line includes a sense line portion 45 or 46, to which the bit lines 33 connect, and an external portion 47 or 48 which forms a bus line to connect with external circuitry. The sense line portions 45, 46 are separated from the external connection portions 47, 48 by multiplexing transistors 51, 52 which multiplex the I/O lines between multiple arrays connected to the external connection portions 47, 48. Significantly, the multiplexing transistors 51, 52 permit the potentials of the sense line portions 45, 46 to float with respect to the external connection portions 47, 48 whenever the multiplexing transistors 51, 52, are gated OFF. A sense amp including a helper flip-flop 53 is used to detect levels of the sense line portions 45, 46 after signals are provided from the array by the digit lines 33, pursuant to a READ operation. During the READ operation, signals are provided from the external portions 47, 48 of the I/O lines 41, 42, provided that the multiplexing transistors 51, 52 are gated ON.

Signals from the bit line 33 are at low current levels. Therefore, the precharge transistors 55, 56, and a precharge equalization or coupling transistor 57 are used to provide a desired signal level to the sense line portions 45, 46 of the I/O lines. The precharge and equalization transistors 55, 57 set the sense line portions 45, 46 at levels such that, when signals are provided by the digit lines 33, the sense line portions 45, 46 can be quickly pumped to levels corresponding to their signals.

A diode 61 is separately connected in series with each of the precharge transistors 55, 56 and the diode 61 is connected to a supply potential $V_{CC}$. Therefore, the precharge transistors 55, 56 are each connected to the diode 61. The diode 61 has a threshold voltage $V_T$ which is at a predetermined level. Current through the diode 61 passes until the potential across the diode 61 is at that threshold level $V_T$. Therefore, potential to the precharge transistors 55, 56 is limited to $V_{CC}$ minus the threshold voltage $V_T$ of the diode 61 (or $V_{CC} - V_T$).

Figure 4:
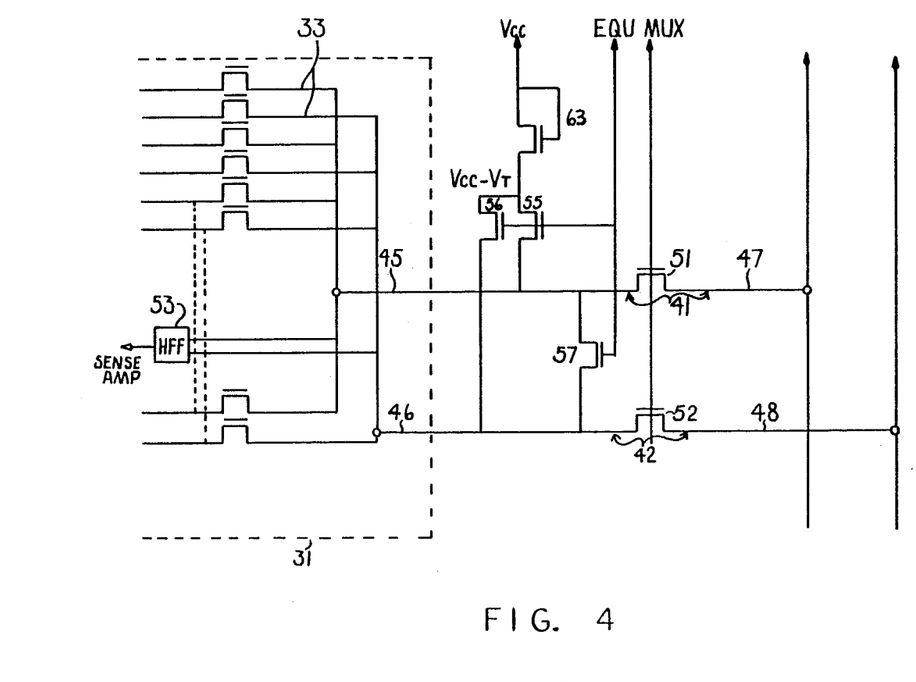
FIG. 4 shows the configuration of FIG. 3, modified by the use of a transistor for reducing the precharge level of the I/O lines.

FIG. 4 shows a modification to the circuit of FIG. 3, in which transistor 63 is connected as a diode in series with the precharge transistors 55, 56 and to the supply potential $V_{CC}$. Transistor 63 is fabricated with the precharge and equalization transistors 55, 57, and therefore would have a threshold voltage $V_T$ which closely approximates the desired level.

This threshold voltage $V_T$ may be "fine tuned" when designing the circuit layout for the semiconductor. As is the case with the diode 61 of FIG. 3, current through transistor 63 passes until the potential across the transistor 63 is at the threshold level $V_T$, so that potential to the precharge transistors 55, 56 is limited to $V_{CC}$ minus the threshold voltage $V_T$.

It turns out that N-channel transistors, when gate and drain are at $V_{CC}$, will have source settle at a potential of $V_{CC} - V_T$. This has the effect of eliminating the inclusion of a separate diode 61 or transistor 63 in the circuit. Therefore, diode 61 merely becomes a part of an equivalent circuit and does not appear as a circuit element distinct from transistors 55, 56.

The precharge and equilization transistors 55-57 are n-well transistors and their n-wells are biased to $V_{CC}$. Since the supply potential to these transistors is limited to any $V_{CC} - V_T$, forward biasing of pn junctions in these transistors 55-57 can occur when potential on the I/O lines exceeds the $V_{CC}$ level. In this case, $V_{CC}$ has to decrease by $V_T$ (of the diode 61) for that to occur in precharge transistors 55, 56. The supply voltage $V_{CC}$ must increase by twice the threshold voltage of one of the precharge or equilization transistors 55-57 (assuming that all threshold levels are more-or-less equal) in order that such forward biasing can occur at the equilization transistor 57.

Figure 5:
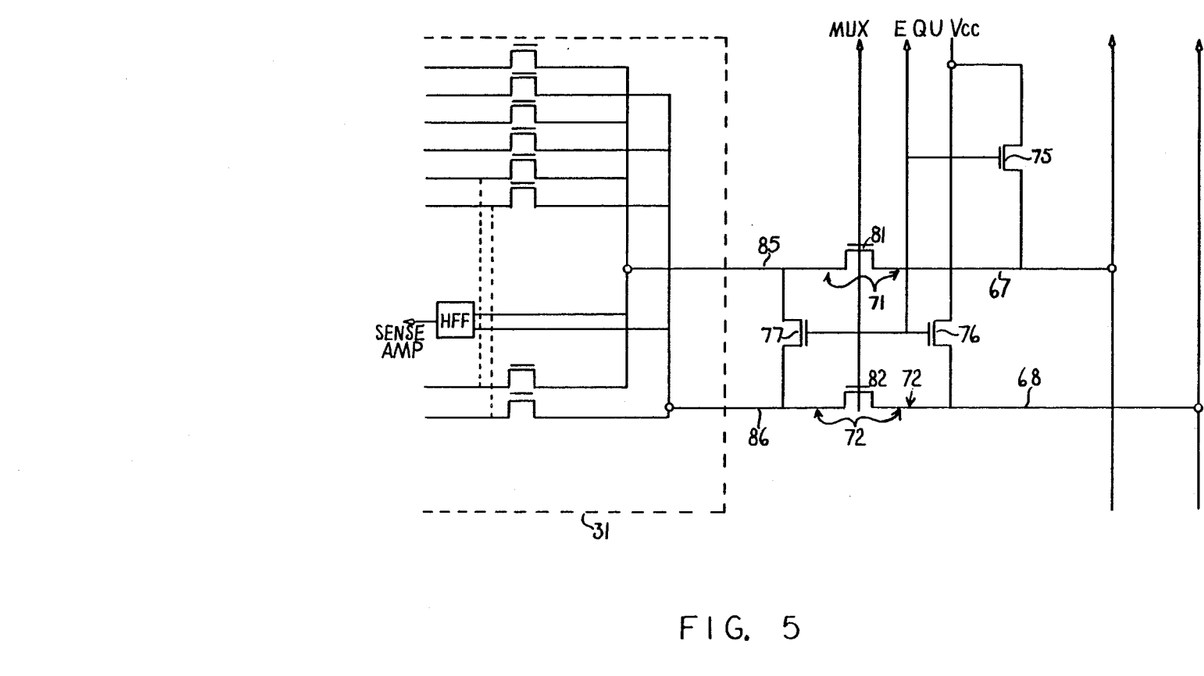
FIG. 5 shows a configuration in which multiplex isolation transistors are used to reduce precharge levels by $V_T$.

FIG. 5 shows an alternate embodiment of the invention, in which precharge current is supplied through external connection portions 66, 68 of I/O lines 71, 72. As in the previous embodiment, the current is provided through a pair of precharge transistors 75, 76, and an equalization transistor 77 shunts the I/O lines 71, 72 during the precharge cycle. Multiplexing transistors 81, 82 are used to isolate the array 31 from the external connections 67, 68. The precharge current and the precharge transistors 75, 76 must pass through the multiplexing transistors 81, 82 in order to supply the precharge current to sense line portions 85, 86 of the I/O lines 71, 72. This, of course, means that, in order for precharge current to flow to the sense line portions 85, 86, the multiplexing transistors 81, 82 must be gated ON. Equalization transistor 77 is directly connected to the sense line portions 85, 86.

It turns out that it is possible to gate ON the multiplexing transistors 81, 82 during the precharge period without adversely affecting the signal inputs and outputs of a DRAM. If the precharge current were supplied directly to the sense line portions 85, 86 then the precharge current would be drained through the multiplexing transistors 81, 82 to an indeterminate level until such time that the multiplexing transistor 81, 82 were gated OFF. On the other hand, if precharge transistors 75, 76 supply their current through the multiplexing transistors 81, 82 the precharge voltage would be supplied directly to the external connection portions 67, 68 of the I/O lines 71, 72.

Since precharge transistors 75, 76 supply their current through the multiplexing transistors 81, 82, the precharge voltage supplied to the sense line portions 85, 86 of the I/O lines 71, 72 is reduced by the threshold voltages $V_T$ of the multiplexing transistors 81, 82.

The multiplexing transistors 81, 82 are fabricated along with precharge transistors 75, 76 and equalization transistors 77. Therefore, the threshold voltages $V_T$ of multiplexing transistors 81, 82 are approximately that of the threshold voltages of the precharge transistors 75, 76. This is because, in multi-mask semiconductor fabrication, it is convenient to fabricate the transistors (such as transistors 75-77 and 81, 82) during the same masking steps. Thus, variations in threhold voltages between transistors usually must be deliberate. In this case, voltages of the transistors are established at desired levels such that $V_T$ multiplexing transistors 81, 82 match the desired voltage drop for voltage applied to the sense line portions 85, 86 of the I/O lines.

This reduced threshold voltage has little effect on precharge transistors 75, 76, but reduces the precharge voltage seen by the equlization transistor 77. If $V_{CC}$ "bumps" down after the precharge cycle, then the external connection portions 66, 68 of I/O lines 71, 72 are isolated from the precharge voltage of the sense line portions 85, 86, and the precharge transistors 75, 76 are therefore less subject to latching.

The precharge voltage between the gate of the equlization transistor 77 and the precharged sense line portions 85, 86 which is most critical in avoiding latchup and in avoiding ambiguities in the sensed signal levels across the I/O lines 71, 72. By precharging the sense line portions 85, 86 through multiplexing transistors 51, 52, the precharge of the sense line portions 85, 86 is reduced by a voltage equal to $V_T$ of the multiplexing transistors 51, 52. This reduces the precharge potentials that equalization transistor 77 is exposed to. Since, precharge transistors 75, 76 are not floated with the sense line portions 85, 86 of the I/O lines 71, 72, the precharge transistors 75, 76 are less affected by $V_{CC}$ "bumping" down.

From the above description, it is clear that the inventive concepts can implemented in a number of ways. While two specific embodiments of the invention have been shown, along with one specific application of precharged signal lines (from a DRAM memory cell array), the inventive concepts are applicable to a variety of circuitry.

What is claimed is:

1. In a semiconductor circuit device having a signal generating source, at least two signal lines which are precharged to signal sensing levels, a precharge circuit which precharges the signal lines, an equilization transistor for equalizing the precharge signal levels across the signal lines, and a signal level voltage source, the circuit device comprising:
   (a) the precharge circuit including a plurality of precharge transistors for conducting current to different signal lines during said precharging of the signal lines in order to precharge voltage levels;
   (b) a junction device interposed between the signal level voltage source and the precharge transistors so that when the signal lines are being precharged, the current for precharging the signal lines passes through said junction device;
   (c) the junction device having a threshold voltage which is substantially equivalent to a desired voltage drop from signal level voltage to the precharge voltage levels, thereby lowering forward bias of the precharge transistors by providing a precharge which is at a threshold voltage below bias voltage, and reducing distortion in signal levels of the signal lines when voltage at the signal level voltage source "bumps" downward by permitting the allowed range of power supply voltage bumping to be increased by and amount equal to said threshold voltage.

2. The semiconductor device as described in claim 1, further comprising:
   when the signal lines are being precharged by the precharge transistors, the equilization transistor being gated by signals at the signal level voltage.

3. The semiconductor device as described in claim 2, further comprising:
   said junction device being an n-channel diode which has a threshold voltage corresponding to a desired voltage drop.

4. The semiconductor device as described in claim 2, further comprising:
   said junction device being a transistor connected as a diode, in series with said precharge transistors, and having a threshold voltage corresponding to a desired voltage drop.

5. The semiconductor device as described in claim 2, further comprising:
   (a) said junction device being the plurality of precharge transistors for conducting current to different signal lines during said precharging of the signal lines;
   (b) The precharge transistors being N-channel transistors having threshold voltages corresponding to the desired voltage drop.

6. The semiconductor device as described in claim 5, further comprising:

the equalization transistors having n channels which are connected so as to remain fully biased, thereby increasing the voltage "bump" tolerance of the transistors.

7. The semiconductor device as described in claim 2, further comprising:
the n channels of the equalization transistors being connected so as to remain fully biased, thereby increasing the voltage "bump" tolerance of the transistors.

8. In a dynamic access memory array, which includes an array of capacitor cells corresponding to memory address locations, at least two signal lines which are precharged to signal sensing levels, a circuit for providing signals corresponding to signal levels in ones of the capacitor cells to the signal lines, a precharge circuit which precharged the signal lines, an equilization transistor for equalizing the precharge signal levels across the signal lines, a signal level voltage source, the circuit device comprising:
(a) the precharge circuit including a plurality of precharge transistors for conducting current to different signal lines during said precharging of the signal lines in order to precharge voltage levels;
(b) a junction device interposed between the signal level voltage source and the precharge transistors so that when the signal lines are being precharged, the current for precharging the signal lines passes through said junction device;
(c) the junction device having a threshold voltage which is substantially equivalent to a desired voltage drop from signal level voltage to the precharge voltage levels, thereby lowering forward bias of the precharge transistors by providing a precharge which is at a threshold voltage below bias voltage, and reducing distortion in signal levels of the signal lines when voltage at the signal level voltage source "bumps" downward by permitting the allowed range of power supply voltage bumping to be increased by and amount equal to said threshold voltage.

9. The semiconductor device as described in claim 8, further comprising:
the equilization transistor being gated by signals at the signal level voltage.

10. The semiconductor device as described in claim 9, further comprising:
said junction device being an n-channel diode which has a threshold voltage corresponding to a desired voltage drop.

11. The semiconductor device as described in claim 9, further comprising:
said junction device being a transistor connected as a diode, in series with said precharge transistors, and having a threshold voltage corresponding to a desired voltage drop.

12. The semiconductor device as described in claim 9, further comprising:
(a) said junction device being the plurality of precharge transistors for conducting current to different signal lines during said precharging of the signal lines;
(b) The precharge transistors being N-channel transistors having threshold voltages corresponding to the desired voltage drop.

13. The semiconductor device as described in claim 12, further comprising:
the equalization transistors having n channels which are connected so as to remain fully biased, thereby increasing the voltage "bump" tolerance of the transistors.

14. The semiconductor device as described in claim 9, further comprising:
the n channels of the equalization transistors being connected so as to remain fully biased, thereby increasing the voltage "bump" tolerance of the transistors.

* * * * *

REEXAMINATION CERTIFICATE (2137th)
United States Patent [19]
Parkinson et al.

[11] B1 4,962,326
[45] Certificate Issued Nov. 16, 1993

[54] REDUCED LATCHUP IN PRECHARGING I/O LINES TO SENSE AMP SIGNAL LEVELS

[75] Inventors: Ward D. Parkinson; Wen-Foo Chern, both of Boise, Id.

[73] Assignee: Micron Technology, Inc., Boise, Id.

Reexamination Request:
No. 90/002,870, Oct. 20, 1992

Reexamination Certificate for:
Patent No.: 4,962,326
Issued: Jul. 22, 1988
Appl. No.: 222,842
Filed: Oct. 9, 1990

[51] Int. Cl.⁵ .................. H03K 17/16; H03K 19/003
[52] U.S. Cl. ................................. 307/443; 307/530; 307/565; 365/203

[56] References Cited
U.S. PATENT DOCUMENTS

| | | | |
|---|---|---|---|
| 3,953,839 | 4/1976 | Dennison et al. | 340/173 R |
| 4,028,557 | 6/1977 | Wilson | 307/362 |
| 4,144,590 | 3/1979 | Kitagawa et al. | 365/205 |
| 4,670,861 | 1/1987 | Shu et al. | 365/181 |
| 4,712,193 | 12/1987 | Baskett | 365/190 |
| 4,780,850 | 10/1988 | Miyamoto et al. | 365/189 |
| 4,780,852 | 10/1988 | Kajigaya et al. | 365/203 |
| 4,893,278 | 1/1990 | Ito | 365/203 |
| 4,903,238 | 2/1990 | Miyatake et al. | 365/189.06 |
| 4,918,663 | 4/1990 | Remington et al. | 365/226 |

OTHER PUBLICATIONS

"Bit Line Restore Circuit for High–Speed CMOS Arrays", IBM Technical Disclosure Bulletin, vol. 28, No. 3, Aug. 1985.

RCA Technical Note #1230, Jul. 1979, Dingwall "Improved COS/MOS Inverter Circuit for Reducing Burn-Out and Latchup".

*Primary Examiner*—Edward Westin

[57] ABSTRACT

I/O lines on a CMOS circuit are precharged to preferred voltage levels in order to avoid latch up. The precharging is achieved by using N channel transistors to provide a precharge which is at a threshold voltage ($V_T$) below bias voltage $V_{CC}$, or ($V_{CC}$-$V_T$). This results in a lower forward bias when $V_{CC}$ bumps down after the I/O lines are floated. By lowering the precharge voltage by a level corresponding to a threshold voltage ($V_T$), the allowed range of power supply voltage bumping is increased by this amount. This eliminates the destructive effect of a negative bump of $V_{BE}$, which would have presented a diode forward bias condition. Instead, the power supply may bump to ($V_{BE}$+$V_T$).

FIG. 3

FIG. 4

REEXAMINATION CERTIFICATE ISSUED UNDER 35 U.S.C. 307

THE PATENT IS HEREBY AMENDED AS INDICATED BELOW.

The drawing figure(s) have been changed as follows: In FIGS. 3 and 4 reference number 33 with accompanying lead lines has been moved from the right side of the transistors of array 31 to the left side of the transistors of array 31.

AS A RESULT OF REEXAMINATION, IT HAS BEEN DETERMINED THAT:

Claims 1-14 are cancelled.

* * * * *